(12) United States Patent
Sakoh

(10) Patent No.: US 7,579,266 B2
(45) Date of Patent: Aug. 25, 2009

(54) FUSE STRUCTURE FOR SEMICONDUCTOR INTEGRATED CIRCUIT WITH IMPROVED INSULATION FILM THICKNESS UNIFORMITY AND MOISTURE RESISTANCE

(75) Inventor: Takashi Sakoh, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/947,807

(22) Filed: Nov. 30, 2007

(65) Prior Publication Data

US 2008/0081454 A1     Apr. 3, 2008

Related U.S. Application Data

(62) Division of application No. 11/037,166, filed on Jan. 19, 2005, now Pat. No. 7,323,760.

(30) Foreign Application Priority Data

Jan. 19, 2004 (JP) .............................. 2004-010596

(51) Int. Cl.
 *H01L 21/44* (2006.01)

(52) U.S. Cl. .................. 438/601; 438/132; 257/529; 257/E21.592; 257/E23.147

(58) Field of Classification Search ............... 438/132, 438/601, 215, 281, 333, 467; 257/209, 529, 257/E21.592, E23.147
See application file for complete search history.

(56) References Cited

U.S. PATENT DOCUMENTS

| 6,100,116 A * | 8/2000 | Lee et al. ..................... 438/128 |
| 6,300,232 B1 | 10/2001 | Satoh |
| 6,518,643 B2 * | 2/2003 | McDevitt et al. ............ 257/529 |
| 6,756,620 B2 | 6/2004 | Li et al. |
| 6,835,999 B2 | 12/2004 | Omura et al. |

OTHER PUBLICATIONS

K. Arndt et al., Reliability of Laser Activated Metal Fuses in DRAMS, 1999 IEEE/CPMT Int'l Electronics Manufacturing Technology Symposium, p. 389-394.

* cited by examiner

*Primary Examiner*—Quoc D Hoang
(74) *Attorney, Agent, or Firm*—Young & Thompson

(57) ABSTRACT

When the film thickness of an insulating film on a fuse connected to a circuit is not uniform within a wafer surface, there was a problem that disconnection of the fuse might become insufficient due to the insufficient intensity of a laser or disconnection of even an adjacent fuse due to excessive laser irradiation might occur. Further, a problem also occurred that after disconnection of the fuse, moisture entered from exterior through the region in which the fuse has been disconnected, so that the quality of a film underlying the fuse was adversely affected. After a SiON film, a SiN film, and a SiO$_2$ film have been formed to cover the fuse in this stated order, etching is performed to the SiN film, which is an etching stopper film. The SiON film having a uniform and desired film thickness is thereby formed on the fuse.

8 Claims, 5 Drawing Sheets

US 7,579,266 B2

FUSE STRUCTURE FOR SEMICONDUCTOR INTEGRATED CIRCUIT WITH IMPROVED INSULATION FILM THICKNESS UNIFORMITY AND MOISTURE RESISTANCE

FIELD OF THE INVENTION

The present invention relates to a semiconductor device including circuit elements such as a memory and logic and a manufacturing method thereof.

BACKGROUND OF THE INVENTION

Conventionally, some memories such as DRAMs in semiconductor devices include fuses so as to cause redundancy bits replacing defective bits to function (refer to Nonpatent Document 1, for example). The operation of the semiconductor device is checked after a wafer manufacturing process thereof, and if a defective bit is detected, a laser is irradiated onto a fuse connected to the defective bit for disconnection, so as to replace the defective bit with a redundancy bit.

As the method of using fuses in the semiconductor device, there is provided a method as follows, in addition to the method in case of the memory. Assume that recording of information "1" or "0" is performed, responsive to a state where the fuse is disconnected or not. Then, by providing 128 fuses for each semiconductor chip, for example, information corresponding to 128 bits can be recorded on each semiconductor chip. If the information to be recorded is an identifier that differs from one semiconductor chip to another, by reading the information recorded for the fuse, each semiconductor chip becomes distinguishable.

As other method of using fuses, there is provided a semiconductor device in which fuses for voltage adjustment in the semiconductor device is provided, an internal voltage is measured after the wafer manufacturing process, and then certain fuse or fuses is/are disconnected to obtain a desired voltage.

A configuration of the semiconductor device in case of Non patent Document 1 is explained below.

FIG. 5 is a schematic sectional view showing an example of the configuration of the conventional semiconductor device.

In this semiconductor device, semiconductor elements (not shown) such as transistors, capacitors, and resistances and a base insulating film 101 are formed on a semiconductor substrate 100. Then, as shown in FIG. 5, copper (Cu) wiring (connection) 120 is formed in a $SiO_2$ film 102 formed as an insulating film for embedding of wiring, and Al (aluminum) wiring (connection) 124 is formed on the Cu wiring 120. An interlayer insulating film between the Cu wiring 120 and the Al wiring 124 for portions other than a connecting portion between the Cu wiring 120 and the Al wiring 124 is a single layer $SiO_2$ film 210. Further, a fuse 122 is covered with a $SiO_2$ film 210. The formed film thickness of the $SiO_2$ film 210 is approximately 1 μm. A SiON film 212 is formed on the $SiO_2$ film 210, and its film thickness is approximately 1 μm.

The fuse 122 is connected to the circuit through wiring not shown. The fuse 122 is also formed at the same layer as a Cu corrosion preventive film 123, and is a multilayer conductive film formed by sequentially stacking Ti and TiN films, which will be hereinafter written as a "TiN/Ti structure".

While the Al wiring 124 in FIG. 5 serves as a bonding pad section 126, other Al wiring (not shown) formed at the same layer as the Al wiring 124 serves to establish electrical connection between elements.

When openings for bonding shown in FIG. 5 are formed, the time for etching the $SiO_2$ film 210 was controlled to leave only a predetermined film thickness of the $SiO_2$ film 210 on the fuse 122.

[Non Patent Document 1]

K. Arndt et al., Reliability of Laser Activated Metal Fuses in DRAMS, 1999 JEEE/CPMT Int'l Electronics Manufacturing Technology Symposium, p. 389-394

SUMMARY OF THE DISCLOSURE

As described above, when only the predetermined film thickness of the insulating film on the fuse is to be left by performing etching for the predetermined time of the etching alone, the speed of the etching varies with a chamber atmosphere in an etching device. Thus, even if processing is performed in the same etching time, the film thickness of the insulating film on the fuse sometimes varied greatly among wafers or wafer surfaces. When the film thickness of the insulating film on the fuse becomes thinner than the set value, energy to be irradiated onto the fuse sometimes becomes too strong, and then, not only the fuse to be disconnected but also an adjacent fuse is sometimes disconnected even if irradiating conditions such as the spot diameter of the laser and the irradiation energy are the same. On the contrary, if the film thickness of the insulating film on the fuse becomes thicker than the set value, a problem arises that the energy of the laser becomes insufficient, so that the fuse cannot be disconnected.

For this reason, when the film thickness of the insulating film on the fuse varies even if the irradiating conditions of the laser are controlled to be the same each time the fuse is disconnected, a "disconnection fault" in which the fuse cannot be disconnected, or "erroneous disconnection" of disconnecting even an adjacent fuse tends to occur. Reduction of the yield of the device might be therefore brought about.

Further, in the conventional example, the insulating film on the fuse is only the $SiO_2$ film. Thus, moisture would enter from the exterior through the opening provided above the fuse. Due to this moisture, a change in the characteristics or corrosion of the copper wiring will occur. When a Low-k film, which has a dielectric constant lower than the silicon oxide film, is in a layer below the fuse and when the moisture enters into the Low-k film, the interconnect capacitance of the Low-k film will increase. Deterioration in the long-term reliability of the semiconductor device might be brought about.

It is an object of the present invention to provide a semiconductor device in which the film thickness of an insulating film on a fuse is uniform and entry of moisture is prevented, and a manufacturing method thereof.

A semiconductor device according to a first aspect of the present invention includes a circuit formed on a semiconductor substrate and a fuse connected to the circuit, and further comprises a silicon oxide film including nitrogen, formed to cover the fuse.

Further, the circuit may include copper wiring (or connection). In the present invention, the insulating film disposed above the fuse (or fuses) is the silicon oxide film including nitrogen. Thus, entry of the moisture from the insulating film disposed on the fuse is prevented, and corrosion of the copper wiring is prevented.

The semiconductor device according to a second aspect of the present invention is characterized by including a base insulating film disposed under a fuse (or fuses) and a guard ring embedded in the base insulating film and disposed to surround the periphery of the fuse (or fuses). In the present invention, the guard ring is provided in the layer underlying the fuse (or fuses). Thus, even if the fuse is disconnected, diffusion of the moisture entered from the spot of fuse disconnection is prevented.

Further, the guard ring may be disposed in the same plane as a metal wiring.

Moreover, the silicon oxide film including the nitrogen may include SiON. In the present invention, since the silicon oxide film including nitrogen is a SiON film, entry of the moisture can be prevented more effectively than the case with the silicon oxide film.

According to a third aspect of the present invention, there is provided a method of manufacturing a semiconductor device comprising the steps of:

forming a fuse disposed on a semiconductor substrate;
forming a silicon oxide film including nitrogen to cover the fuse;
forming an etching stopper film over the silicon oxide film including nitrogen;
forming an insulating film at an area above the etching stopper film;
removing the insulating film at the area above the fuse; and
removing the etching stopper film over the fuse.

In the present invention, the etching stopper film is present. Thus, when the silicon oxide film is etched, the etching is stopped by the etching stopper film. Then, when etching of the etching stopper film is performed, variation in the film thickness of the silicon oxide film including nitrogen is reduced more efficiently than the case with a conventional art.

Further, the silicon oxide film may include SiON.

Preferably, the film thickness of the silicon oxide film including nitrogen is set to 150 to 300 nm, and more preferably, set to 180 to 250 nm.

According to a fourth aspect of the present invention, there is provide a method of manufacturing a semiconductor device comprising the steps of:

forming a base insulating film over a semiconductor substrate;
forming metal wiring in the base insulating film;
forming a fuse disposed on the base insulating film;
forming a first silicon oxide film including nitrogen to cover the fuse and the wiring;
forming an etching stopper film over the first silicon oxide film;
forming an insulating film over the etching stopper film;
removing the first silicon oxide film, the etching stopper film, and the insulating film formed above a part of the wiring;
forming a bonding pad connected to the wiring;
forming a second silicon oxide film including nitrogen to cover the bonding pad;
forming an organic film over the second silicon oxide film;
removing the organic film and the second silicon oxide film formed above an area of the bonding pad and also removing the organic film, the second silicon oxide film and the insulating film formed above an area of the fuse; and
removing the etching stopper film formed on the part of the fuse. In the present invention, when the insulating film is etched, etching is stopped at the etching stopped film.

Thus, the variation in the film thickness of the first silicon oxide film is reduced more effectively than the case with the conventional art. Further, there is no need for performing separate etching of the films above the pad and the films above the fuse. Thus, photolithography of the organic film can be performed just once. The metal wiring may be Cu or Cu-based alloy.

Further, the first silicon oxide film and the second silicon oxide film may comprise SiON.

Still further, the etching stopper film may include a silicon nitride film or a SiCN film. In the present invention, the etching stopper film includes at least either of the silicon nitride film and the SiCN film. Thus, under the condition in which the silicon oxide film is etched, the etching rate of the etching stopper film becomes lower than the case of the silicon oxide film. The stop of the etching of the silicon oxide film can be thereby detected.

Moreover, preferably, the film thickness of the etching stopper film is set to 30 to 100 nm.

In the present invention, the silicon oxide film including nitrogen is present as an upper insulating film on the fuse (or fuses). Thus, entry of the moisture from the insulating film into the fuse is prevented. When a material such as a Low-k film that is readily affected by the moisture is used as a lower (under) insulating film of the fuse, the influence of the moisture on the Low-k film or the like can be prevented.

Further, in the present invention, when etching for leaving the predetermined thickness of the silicon oxide film including nitrogen on the fuse is performed, the final film thickness of the etched film becomes 30 to 100 nm, which is the film thickness of the etching stopped film and is thinner than the case of the conventional art. For this reason, even if over-etching were to be performed to etch the silicon oxide film including nitrogen, the film thickness variation due to the etching is reduced more than the case with the conventional art, so that the film thickness variation of the silicon oxide film including nitrogen that has remained above the fuse is reduced more efficiently than the case with the conventional art.

The meritorious effects of the present invention are summarized as follows.

In the manufacturing method of the semiconductor device according to the present invention, the etching stopper film for stopping etching is provided over the insulating film disposed above the fuse (or fuses). The film thickness control over the film above the fuse is thereby facilitated. Thus, it becomes possible to leave only the desired film thickness of the SiON film above the fuse (or fuses). For this reason, when the fuse is disconnected by a laser from above the insulating film(s), the semiconductor device is so structured that the variation in the film thickness of the insulating film above the fuse within a wafer and from a wafer to another is reduced. Thus, the proportion of the disconnection fault of the fuse and the erroneous disconnection of the fuse thus can be greatly reduced, so that the yield of the semiconductor device can be improved.

Further, in the semiconductor device of the present invention, the SiON film invariably covers the fuse (or fuses) including the opening provided above the fuse for laser irradiation. Thus, entry of the moisture from the exterior is prevented. For this reason, corrosion and change in the characteristics of the wiring are prevented. Further, even if a Low-k film of which the interconnect capacitance would be increased if the moisture enters thereinto is employed as the interlayer insulating film, entry of the moisture into the Low-k film is prevented. The reliability of the wiring is therefore markedly improved, compared with the manufacturing method of the conventional art. Thus, the reliability of the semiconductor device is improved.

PREFERRED EMBODIMENTS OF THE INVENTION

A semiconductor device according to the present invention is characterized by having a configuration in which an insulating film for covering a fuse and preventing entry of moisture is provided. A manufacturing method of the semiconductor device according to the present invention is characterized by having a step of forming over the insulating film formed to cover the fuse for preventing entry of moisture insulating films including an etching stopper film (which will be hereinafter simply referred to as "stopper film") for stopping etching.

The semiconductor device according to the present invention will be described.

Figure 1:
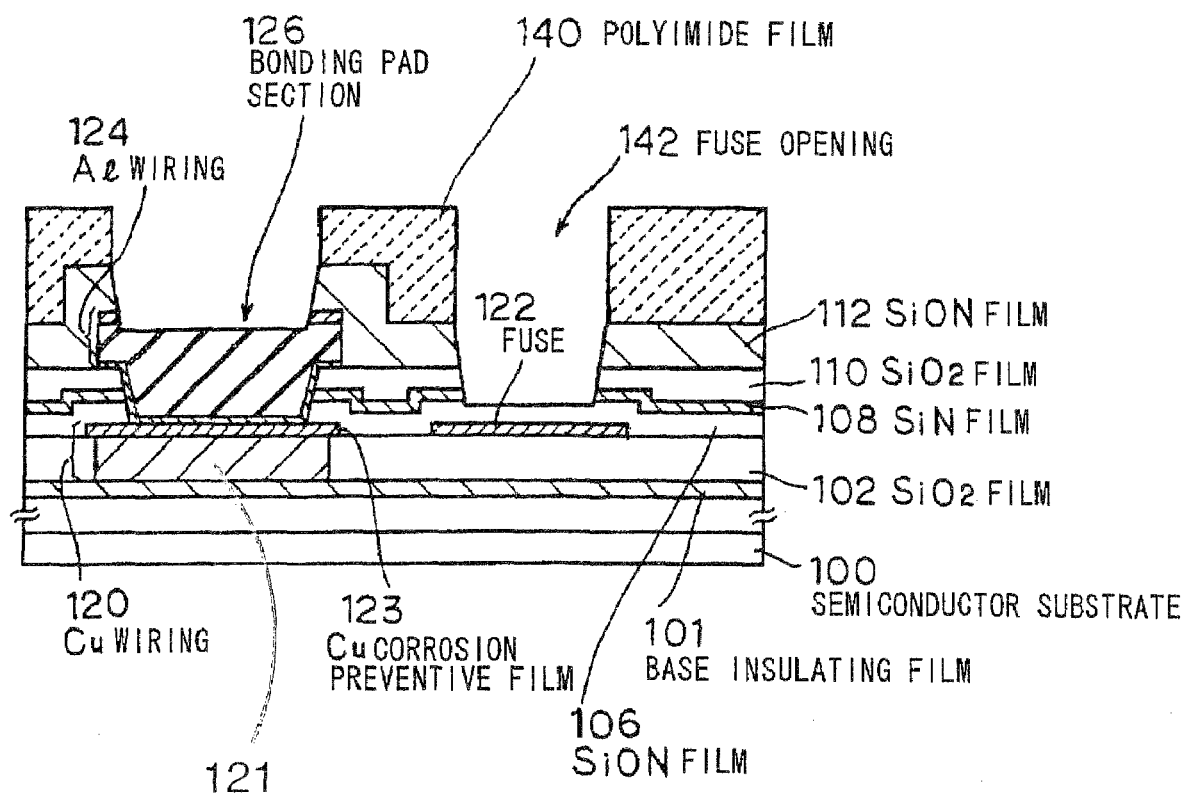
FIG. 1 is a schematic sectional view showing an example of a configuration of a semiconductor device in a first embodiment.

FIG. 1 is a schematic sectional view showing an example of a configuration of the semiconductor device according to the present invention. Though semiconductor elements are disposed on a semiconductor substrate 100 as in the conventional art, illustration of them will be omitted.

As shown in FIG. 1, in the semiconductor device of the present invention, a SiON film 106 is formed over a layer of fuse 122. As interlayer insulating films for portions other than a connecting portion between Al wiring 124 that becomes a top layer wiring and Cu wiring 120 (as a metal wiring) that becomes its lower layer wiring, stacked insulating films of a $SiO_2$/SiN/SiON structure are formed. The fuse 122 is formed of a film of a same quality as a Cu corrosion preventive film 123 of the Cu wiring 120, and is a multilayer conductive film of a TiN/Ti structure. The film thickness of the SiON film 106 above the fuse 122 is set to 150 to 300 nm, and more preferably, set to 180 to 250 nm.

The SiON film 106 is a silicon oxide film including nitrogen and is a film into which moisture is more difficult to enter than the $SiO_2$ film. For this reason, the SiON film 106 not only prevents the moisture from entering into the fuse 122 through a fuse opening 142 but also prevents the moisture from entering into the Cu wiring 120, a $SiO_2$ film 102 and wiring and an insulating film disposed as underlying layers, not shown. Accordingly, if the film thickness is increased beyond the aforementioned range, disconnection of the fuse by laser irradiation becomes difficult. On the other hand, if the film thickness is reduced, the effect of preventing entry of the moisture is lowered.

The fuse 122 is connected to the circuit including the Cu wiring 120 via a wiring, not shown in FIG. 1.

Next, the manufacturing method of the semiconductor device having the configuration described above will be described. FIGS. 2 and 3 are schematic sectional views showing the manufacturing method of the semiconductor device.

Figure 2A:
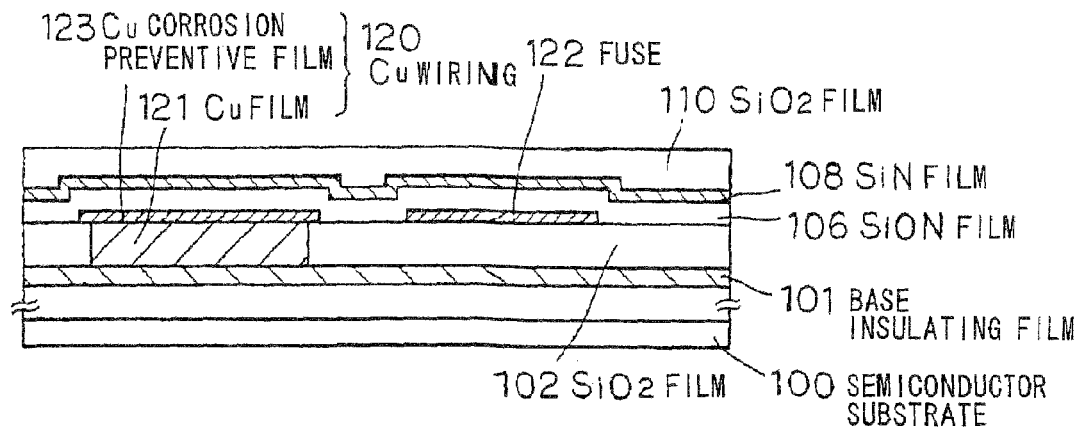
FIGS. 2A-2C show schematic sectional views showing a manufacturing method of the semiconductor device in the first embodiment.

After the semiconductor elements and a plurality of wiring layers, not shown, have been formed on a semiconductor substrate 100, a base insulating film 101 is formed, as shown in FIG. 2A. Then, after a $SiO_2$ film 102 has been formed, grooves for wiring are formed in the $SiO_2$ film 102 by a photolithography process and an etching process. A barrier metal (not shown) is formed in the bottoms and the sidewalls of the formed grooves. Further, Cu is embedded into the grooves by an electrolytic plating method by forming a Cu film 121 covering the $SiO_2$ film 102. After grain growth of Cu is achieved by a heat treatment, Cu covering and disposed on the $SiO_2$ film 102 is removed by a CMP (Chemical and Mechanical Polishing) process to form a Cu film 121 embedded in the groove. The Cu film 121 is not limited to the one of pure Cu and includes the case of a metal film mainly composed of Cu but including other elements, nor limited to Cu. Generally, a suitable metal may be used at need in place of Cu.

Then, after the multilayer conductive film constituted from the Ti film with a film thickness of, e.g., 50 nm and the TiN film with a film thickness of, e.g., 150 nm has been formed, the fuse 122 and the Cu corrosion preventive film 123 that is the multilayer conductive film and covers the top of the Cu film 121 are formed by the photolithography process and the etching process. The Cu wiring 120 including the Cu film 121 and the Cu corrosion preventive film 123 is thereby formed. This Cu corrosion preventive film 123 also serves to increase the strength of the Cu wiring 121.

Thereafter, the SiON film 106 with a film thickness of 200 to 300 nm is formed by a plasma CVD method, and an SiN film 108 with a film thickness of 30 to 100 nm and an $SiO_2$ film 110 with a film thickness of 600 to 700 nm are formed in this order by a CVD method. The SiN film 108 becomes a stopper film for stopping etching of the $SiO_2$ film 110.

Figure 2B:
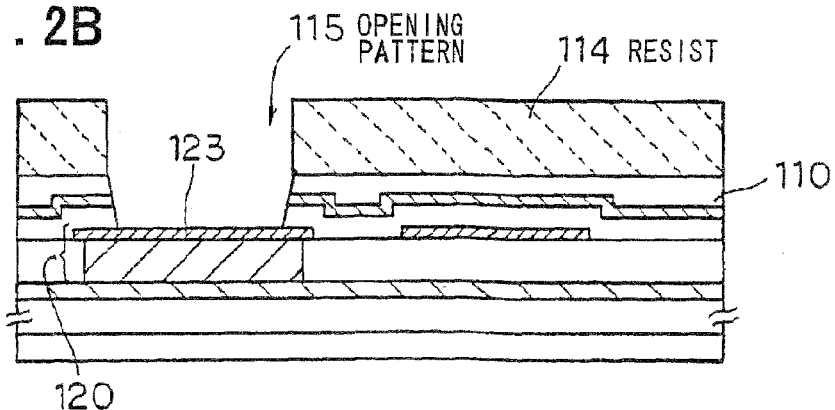

As shown in FIG. 2B, after a resist 114 has been formed over the $SiO_2$ film 110 with a pattern shown in FIG. 2B, exposure and development processes are performed, and an opening pattern 115 is formed in the resist 114 over the Cu wiring 120. Then, anisotropic etching is performed from above the resist 114. The $SiO_2$ film 110, SiN film 108 and SiON film 106 exposed corresponding to the opening pattern 115 are removed, thereby exposing the upper surface of the Cu corrosion preventive film 123.

Figure 2C:
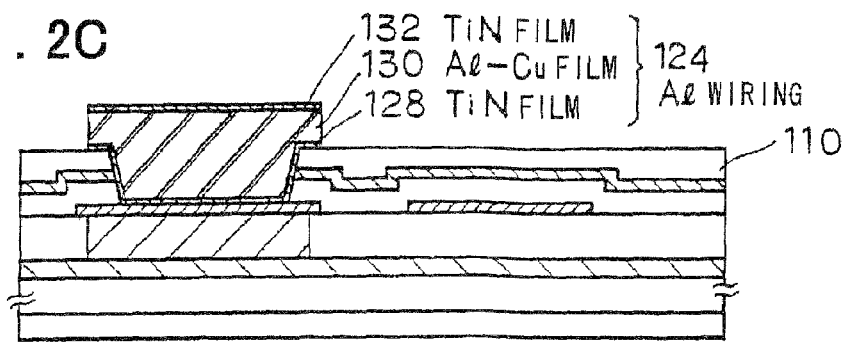

After the resist 114 has been removed, a TiN film 128 with a film thickness of 25 nm as a lower barrier metal film, an Al—Cu film 130 with a film thickness of 1600 nm, and a TiN film 132 with a film thickness of 25 nm as an upper layer barrier metal film are formed in this order. Then, the Al wiring (connection) 124 is formed by the photolithography process and the etching process, resulting the state as shown in FIG. 2C.

Figure 3D:
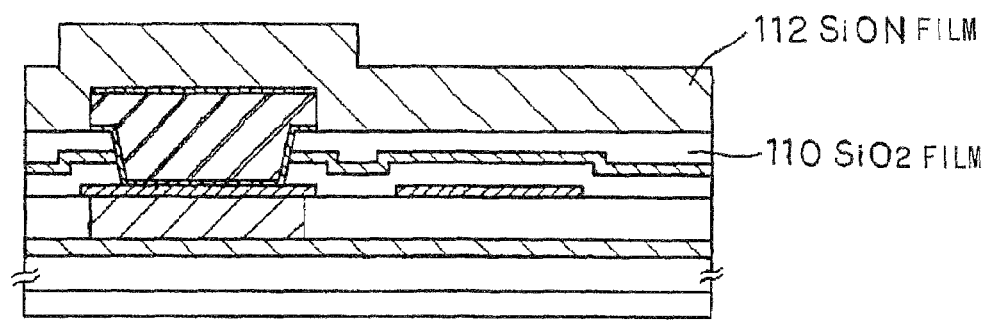
FIGS. 3D-3E show schematic sectional views showing the manufacturing method of the semiconductor device in the first embodiment.

Thereafter, as shown in FIG. 3D, a SiON film 112 with a film thickness of 1000 nm is formed by the plasma CVD method.

Figure 3E:
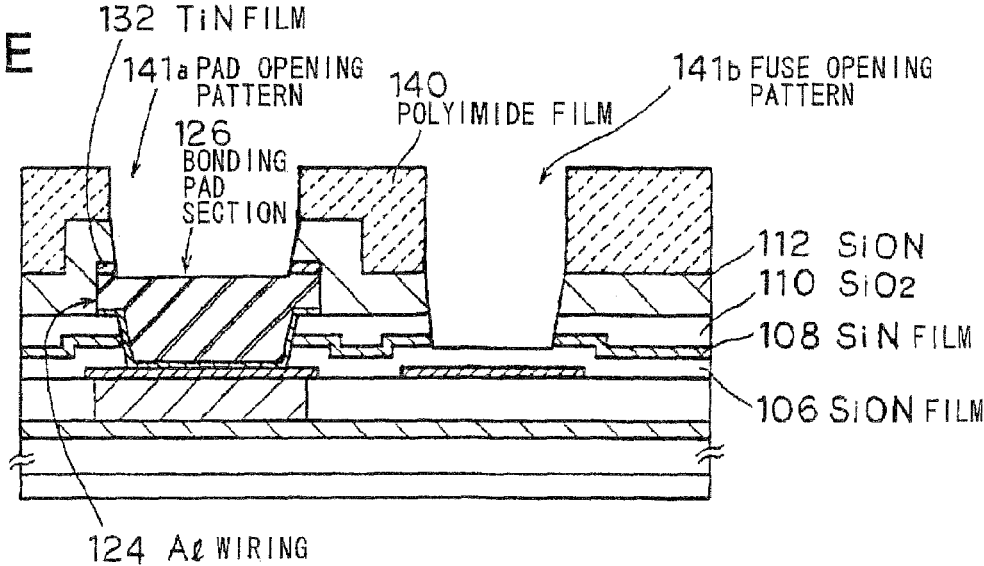

Then, after a polyimide film 140, which will become a protective film, has been applied, a pad opening pattern 141a is formed in the polyimide film 140 over a bonding pad and a fuse opening pattern 141b is formed in the polyimide film 140 over the fuse 122, by a photolithography process using a mask having a pattern that corresponds to FIG. 3E.

Thereafter, specified areas of the SiON film 112 corresponding to the pad opening pattern 141a and the fuse opening pattern 141b are removed by the anisotropic etching. With this arrangement, the upper surface of the TiN film 132 of the Al wiring 124 is exposed in the pad opening pattern. Then, the SiO₂ film 110 corresponding to the fuse opening pattern 141b is removed by performing anisotropic etching under a condition in which silicon oxide films are etched.

The layer underlying the SiO₂ film 110 at the time of etching of the SiO₂ film is the SiN film 108. Thus, under the condition in which the silicon oxide film is etched, the etching rate of the silicon nitride (SiN) film becomes lower than that of the silicon oxide (SiO₂) film, so that the time when the etching of the SiO₂ film 110 has been completed can be well detected.

Thereafter, as patterned area of the SiN film 108 corresponding to the fuse opening pattern 141b is removed by performing the anisotropic etching under the condition in which silicon nitride (SiN) film is etched. On this occasion, only approximately 100 nm of the SiON film 106 can be etched even if 100% over-etching is performed so as to completely remove the SiN film 108. Thus, the SiON film with a film thickness of approximately 200 nm remains on the fuse 122.

Besides, in a bonding pad section 126, when the SiO₂ film 110 and the SiN film 108 of the fuse opening pattern 141b are etched, the TiN film 132 is exposed to etching. Thus, the TiN film 132 is removed. However, when the Al—Cu film 130 is exposed, etching almost stops. The reason for this is that with respect to etch selectivity, which is the ratio of etching rates (and which will be simply referred to selectivity), the selectivity of aluminum to the insulating film is greater than the selectivity of the TiN film to the insulating film, so that aluminum is difficult to be etched under the condition in which the insulating film is etched. As described above, the bonding pad section 126 with the exposed Al—Cu film 130 is formed in the pad opening pattern 141a, so that a good characteristic of connecting to the external connection wiring through wire bonding can be obtained.

Incidentally, the above-mentioned SiON film 106 is a first silicon oxide film including nitrogen according to the present invention, and the SiON film 112 is a second silicon oxide film including nitrogen according to the present invention.

In the present invention, when the insulating films over the fuse 122 are etched, etching is stopped once on the SiN film 108 during etching of the SiO₂ film 110, and the SiN film 108 is then etched, thereby forming the well-controlled film thickness of the SiON film 106. For this reason, variation of the insulating film on the fuse 122 within and from one to another wafer can be reduced. This will be described, compared with the case of the conventional art.

When the SiON film and the SiO₂ film are formed to have a combined thickness of several μm over the fuse as in the conventional art and if the insulating films are etched through time control, a film thickness variation on the fuse will be greatly increased due to the etching rate variation within wafer surfaces and a variation at the time of formation of the insulating films. Assume a film thickness variation of an etchable film with respect to an etched film is 10%, for example. Then, when the film thickness of the etched films is 2.0 μm, the film thickness variation of the etchable films becomes 0.2 μm. On contrast therewith, when the film thickness of the etched films is 0.2 μm, the film thickness variation of the etchable films becomes 0.02 μm. Accordingly, by stopping etching on the SiN film once and then etching the SiN film, the film thickness variation of the insulating film on the fuse can be greatly reduced.

If the insulating film on the fuse has a conventional structure and the film thickness of the insulating film on the fuse is to be a desired one, it is necessary to perform the etching twice because the optimum value of the etching time of the insulating films over the bonding pad section is longer than the optimum value of the etching time of the insulating films over the fuse.

On contrast therewith, in the present invention, as described above, during the one-time photolithography process of the polyimide film 140, the pad opening pattern 141a and the fuse opening pattern 141b are formed, and etching of the insulating films over the fuse is stopped on the SiN film once during a subsequent progress of the etching process. Thus, a sufficient etching time for the opening of the bonding pad section 126 is secured, and the film thickness of the SiON film 106 on the fuse can also be formed to a desired one.

Figure 5:
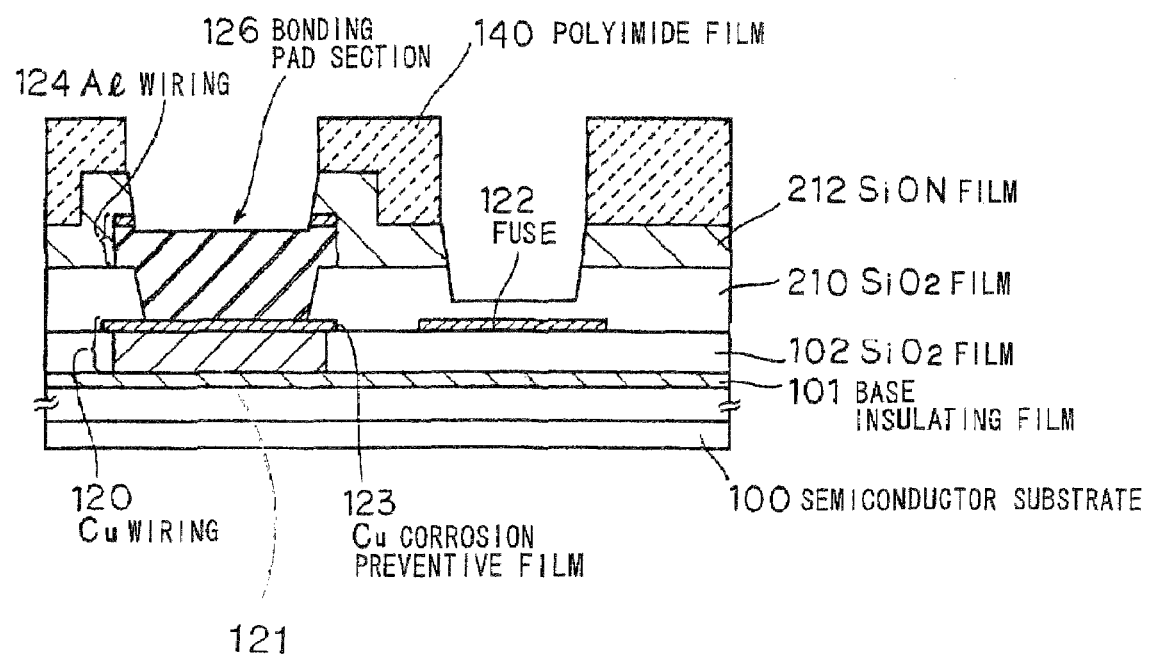
FIG. 5 is a schematic sectional view showing an example of a configuration of a conventional semiconductor device, by way of illustration.

Further, the ability of the SiO₂ film 210 (refer to FIG. 5 concerning the example of the conventional art) to prevent entry of moisture is smaller than that of the SiON film 106. In a conventional manufacturing method, the SiO₂ film 210 is exposed in the fuse opening. Thus, entry of the moisture from there was possible. In the present invention, the top of the fuse is covered with the SiON film 106. Thus, entry of the moisture is efficiently prevented.

In the manufacturing method of the semiconductor device of the present invention, the stacked insulating films of the SiO₂/SiN/SiON structure are formed as the insulating films over the fuse, and the SiN film is used as the stopper film for stopping the etching. Control over the thickness of the film on the fuse thereby becomes possible. Thus, only a desired film thickness of the SiON film on the fuse can be left. For this reason, when the fuse is disconnected from above the insulating films using the laser, the semiconductor device is so structured that the variation in the film thickness of the insulating film on the fuse within the wafer surfaces and between the wafers is reduced. Thus, the proportion of the disconnection fault of the fuse and the erroneous disconnection of the fuse are greatly reduced. Accordingly, the yield of the semiconductor device is improved.

In the semiconductor device of the present invention, the SiON film invariably covers the fuse. Thus, entry of the moisture from an outside is prevented. For this reason, corrosion and change in the characteristics of copper wiring are prevented. Further, even if a Low-k film of which the interconnect capacitance would be increased if the moisture enters thereinto is employed as the interlayer insulating film, entry of the moisture into the Low-k film is prevented. The reliability of the wiring is therefore markedly improved, compared with the manufacturing method as in the conventional art. Accordingly, the reliability of the semiconductor device is improved.

Second Embodiment

In this embodiment, a guard ring is provided for a layer underlying a region in which the fuse 122 (or fuses) is (are) formed in a configuration shown in the first embodiment so as to prevent entry of moisture after disconnection of the fuse.

A configuration of this embodiment will be described. Incidentally, same reference characters are assigned to the same configurations as in the first embodiment, and their detailed description will be omitted.

Figure 4A:
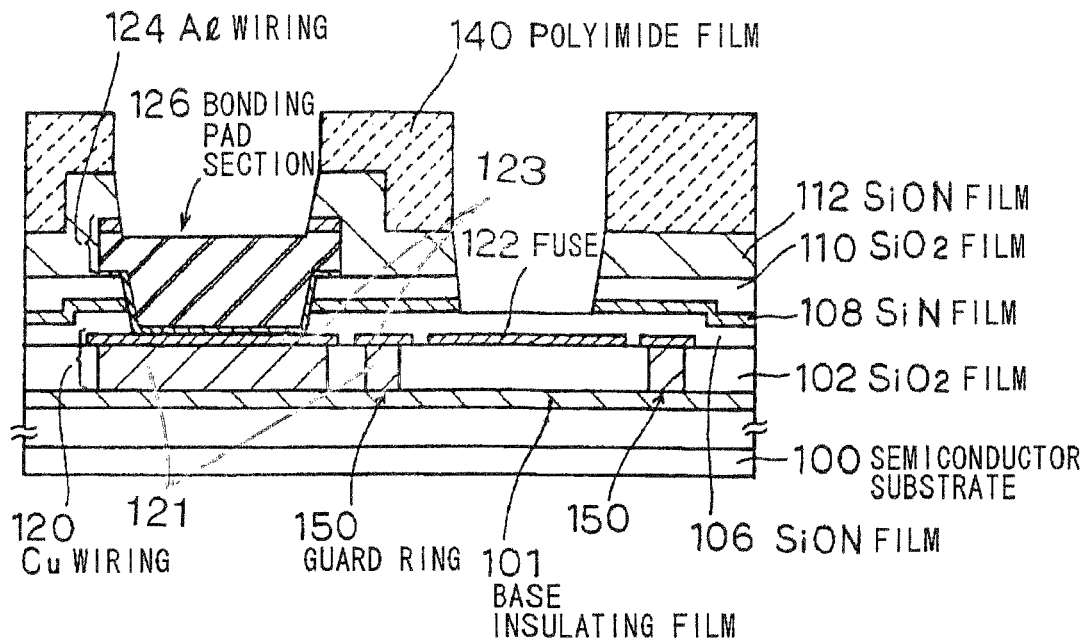
FIG. 4 includes diagrams showing an example of a configuration of a semiconductor device in a second embodiment.
Figure 4B:
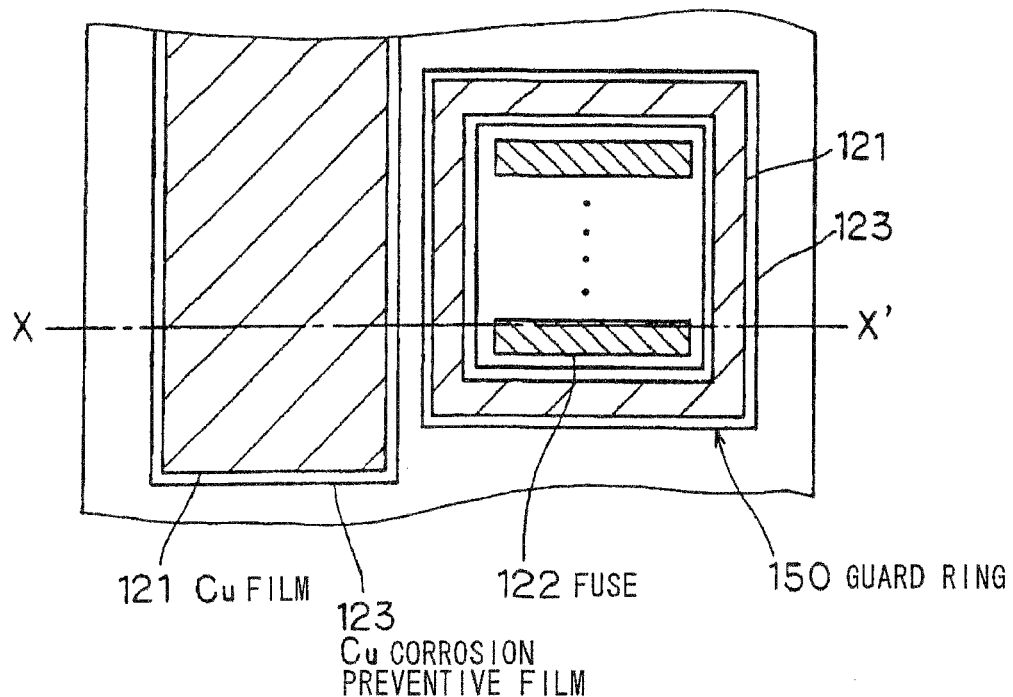

FIG. 4A is a schematic sectional view showing an example of the configuration of this embodiment. FIG. 4B is a schematic plan view showing layer patterns of the Cu wiring 120 and the fuses 122, and a sectional view along a line section X-X' corresponds to FIG. 4A.

As shown in FIGS. 4A and 4B, a guard ring 150 surrounding the planar pattern region of the fuses 122 is formed in the SiO₂ film 102 underlying the fuses 122, using the Cu wiring.

More specifically, the guard ring 150 is formed, being embedded in the SiO$_2$ film 102 that is the base insulating film of the fuses and surrounding the periphery of the fuses 122. This embodiment shows an example where a plurality of the fuses 122 is formed. When the laser is irradiated onto a fuse 122 to disconnect the fuse 122, a part of the SiON film 106 on the fuse 122 and a part of the fuse 122 will disappear. Thus, moisture might enter the SiO$_2$ film 102 through the disappeared parts. Even in a case where the moisture that has entered the SiO$_2$ film 102 would be diffused in a lateral direction below the fuse, the guard ring 150 prevents diffusion of the moisture in the lateral direction. Incidentally, since the guard ring 150 is electrically insulated from other wiring, entry of the moisture into the guard ring 150 itself presents no problem.

Next, an action of the guard ring in the structure shown in FIGS. 4A and 4B will be described.

A plurality of the fuses 122 arranged at a pitch of three to four μm, for example, is provided for a semiconductor chip. When the laser with a spot diameter of 2.7 to 3.3 μm is irradiated onto one fuse 122 for disconnection, a part of the SiON film 106 on the fuse 122 and a part of the fuse 122 are dissipated. Though the moisture enters the SiO$_2$ film 102 through the dissipated part of the SiON film 106 over the disconnected fuse 122 and the dissipated part of the fuse 122, diffusion of the moisture to the lateral direction of the drawing is prevented through the guard ring 150, so that entry of the moisture into the Cu wiring 120 can be prevented.

In the manufacturing method of the semiconductor device having the above-mentioned configuration, the guard ring 150 should be formed by the same process step as the Cu wiring 120. There is therefore no increase in the number of process steps.

In this embodiment, even in a case where the fuse has been disconnected, the entry of the moisture into the inside of the semiconductor device from the fuse opening 142 shown in FIG. 1 can be prevented.

Incidentally, in the first and second embodiments described above, the fuses 122 are formed in the same layer as the Cu corrosion preventive film 123 of the Cu wiring 120. Formation of the fuses 122 is not limited to the same layer as with the Cu corrosion preventive film 123, and may be performed in the film at a layer level higher than that for the Cu corrosion preventive film 123. It is because the moisture that enters from the fuse opening 142 can diffuse in any direction through the SiO$_2$ film 102.

Further, though the fuse 122 is set to be the multilayer conductive film of the TiN/Ti structure, the fuse 122 may be the single layer TiN film.

Further, the stopper film for stopping the etching of the silicon oxide film is set to be the SiN film. The stopper film, however, may be a SiCN film. It is because when the SiCN film is etched under the condition of etching the silicon oxide film, the etching rate of the SiCN film is also reduced as is the case with the SiN film.

Moreover, the oxygen-nitrogen content ratio of the SiON film 106 is not limited to one to one.

Further, though the top layer wiring is set to be the single layer of the Al wiring 124, the top layer wiring may be either of a TiN single layer structure, a TiN/Ti multilayer structure, a TiN/Cu multilayer structure, and a TiN/Ti/Cu multilayer structure.

Moreover, though a description was given in the case of the bonding pad 126 as the pad for establishing connection to the exterior, the pad is not limited to the pad for wire bonding.

Still further, an example was shown where the copper wiring was employed as the wiring. However, even when the wiring other than the copper wiring is employed, and even when a material that might be affected by corrosion or the like due to the moisture is used for the wiring, the corrosion of the wiring due to the moisture can be prevented by utilizing the present invention. Further, even when the wiring will not be corroded due to the moisture but when a material such as the Low-k film that is readily affected by the moisture is employed as the base insulating film of the fuse, the influence of the moisture on the Low-k film or the like can be prevented by utilizing the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of manufacturing a semiconductor device comprising the steps of:
   forming a fuse directly on a silicon oxide film that is disposed on a semiconductor substrate;
   forming a silicon oxide film including nitrogen to directly cover said fuse;
   forming an etching stopper film directly on said silicon oxide film including nitrogen, said etching stopper film comprising a silicon nitride film;
   forming an insulating film over said etching stopper film;
   removing said insulating film at an area above said fuse; and
   removing said etching stopper film at the area above said fuse to expose said silicon oxide film including nitrogen.

2. The method of manufacturing the semiconductor device according to claim 1, wherein said silicon oxide film including nitrogen comprises SiON.

3. The method of manufacturing the semiconductor device according to claim 1, wherein said etching stopper film comprises a SiCN film.

4. The method of manufacturing the semiconductor device according to claim 1, wherein said etching stopper film has a film thickness of 30 to 100 nm.

5. A method of manufacturing a semiconductor device comprising the steps of:
   forming a base insulating film disposed on a semiconductor substrate;
   forming metal wiring in said base insulating film;
   forming a fuse disposed on said base insulating film;
   forming a first silicon oxide film including nitrogen to directly cover said fuse and said wiring;
   forming an etching stopper film over said first silicon oxide film;
   forming an insulating film over said etching stopper film;
   removing said first silicon oxide film, said etching stopper film, and said insulating film formed above a part of said wiring;
   forming a bonding pad connected to said wiring;
   forming a second silicon oxide film including nitrogen to cover said bonding pad;
   forming an organic film over said second silicon oxide film;
   removing said organic film and said second silicon oxide film formed above an area of said bonding pad and also removing said organic film, said second silicon oxide film and said insulating film formed above an area said fuse; and removing said etching stopper film formed on said part of said fuse.

6. The method of manufacturing the semiconductor device according to claim 5, wherein said metal wiring comprises copper wiring.

7. The method of manufacturing the semiconductor device according to claim 5, wherein said first silicon oxide film comprises SiON.

8. The method of manufacturing the semiconductor device according to claim 5, wherein said second silicon oxide film comprises SiON.

* * * * *